United States Patent
Nagai et al.

[11] Patent Number: 5,677,045
[45] Date of Patent: Oct. 14, 1997

[54] LAMINATE AND MULTILAYER PRINTED CIRCUIT BOARD

[75] Inventors: Akira Nagai; Masatsugu Ogata, both of Hitachi; Shuji Eguchi, Ibaraki-ken; Masahiko Ogino, Hitachi; Toshiaki Ishii, Hitachi; Masanori Segawa, Hitachi; Hiroyoshi Kokaku, Hitachi; Ryo Moteki, Hitachi; Ichiro Anjoh, Koganei, all of Japan

[73] Assignee: Hitachi, Ltd., Tokyo, Japan

[21] Appl. No.: 430,553

[22] Filed: Apr. 28, 1995

Related U.S. Application Data

[63] Continuation-in-part of Ser. No. 266,821, Jun. 27, 1994, abandoned.

Foreign Application Priority Data

Sep. 14, 1993 [JP] Japan .................. 5-228445

[51] Int. Cl.$^6$ .................. B32B 7/00; B32B 3/02; B32B 5/12; B32B 5/16
[52] U.S. Cl. .................. 428/260; 428/96; 428/114; 428/245; 428/288; 428/290; 428/327; 428/265; 428/266; 428/267; 428/901; 361/746; 174/148; 174/256; 174/258
[58] Field of Search .................. 428/96, 114, 288, 428/289, 290, 209, 245, 260, 265–267, 327; 174/148, 256, 258; 156/307.3, 307.4; 361/746

[56] References Cited

U.S. PATENT DOCUMENTS 5,216,278  6/1993  Lin et al. .................. 257/688

FOREIGN PATENT DOCUMENTS

| | | |
|---|---|---|
| 2-219853 | 9/1990 | European Pat. Off. . |
| 0412827A2 | 2/1991 | European Pat. Off. . |
| 0559437A1 | 9/1993 | European Pat. Off. . |
| 0581314A2 | 2/1994 | European Pat. Off. . |
| 51-136173 | 11/1976 | Japan .................. H05K 1/00 |
| 54-138081 | 10/1979 | Japan .................. B32B 15/08 |
| 56-14556 | 2/1981 | Japan .................. C08L 83/04 |
| 58-87041 | 5/1983 | Japan .................. B32B 5/22 |
| 59-67688 | 4/1984 | Japan .................. H05K 1/03 |
| 59-94442A | 5/1984 | Japan .................. H01L 23/30 |
| 60-18145 | 5/1985 | Japan .................. H01L 23/30 |
| 61-100446A | 5/1986 | Japan .................. B32B 15/08 |
| 62-296449A | 12/1987 | Japan .................. H01L 23/30 |
| 63-108021A | 5/1988 | Japan .................. C08G 59/18 |
| 1-160090A | 6/1989 | Japan .................. H05K 3/46 |
| 2-181997A | 7/1990 | Japan .................. H05K 3/46 |
| 2-217240A | 8/1990 | Japan .................. B32B 15/06 |
| 3-91288A | 4/1991 | Japan .................. H05K 1/03 |
| 3-127894A | 5/1991 | Japan .................. H05K 1/03 |
| 4-127493A | 4/1992 | Japan .................. H05K 3/34 |
| 4-356995A | 12/1992 | Japan .................. H05K 3/38 |

OTHER PUBLICATIONS

Tsukada, K., "Plastic Composite Substrates", Circuit Technology, Ibiden Co., Ltd., 8:1, pp. 14–17, 1993.

Inoue et al., "Ceramic Composite Copper–Clad Laminates", Hitachi Chemical Report No. 13, Hitachi Chemical Industry Company Ltd., Jul. 1989.

*Primary Examiner*—Patrick Ryan
*Assistant Examiner*—Cathy F. Lam
*Attorney, Agent, or Firm*—Pennie & Edmonds LLP

[57] ABSTRACT

A laminate capable of mounting semiconductor elements thereon; comprising an insulating layer which is constituted by a resin portion of sea-island structure and a woven reinforcement. The resin portion of sea-island structure is, for example, such that a resin as islands are dispersed in a resin as a matrix. Thus, the insulating layer exhibits a coefficient of thermal expansion of 3.0~10 (ppm/K) in a planar direction thereof and a glass transition temperature of 150~300 (°C.). Owing to these physical properties, thermal stresses which the laminate undergoes in packaging the semiconductor elements thereon can be reduced, so that the connections of the laminate with the semiconductor elements can be made highly reliable.

8 Claims, 3 Drawing Sheets

LAMINATE AND MULTILAYER PRINTED CIRCUIT BOARD

This application is a Continuation-in-Parts of application Ser. No. 08/266,821, filed on Jun. 27, 1994, now abandoned, the contents of which are incorporated herein by reference in their entirety.

BACKGROUND OF THE INVENTION

1. Field of the Invention

The present invention relates to a laminate and a multilayer printed circuit board on each of which semiconductor elements can be mounted.

The present invention, further, relates to a high density and multi-pin semiconductor device and a semiconductor mounting device capable of coping with high speed transmission with good electric characteristic and good mounting reliability.

2. Description of the Related Art

Multilayer substrates of low thermal expansibilities include a substrate having a ceramics core layer, a substrate with ceramics deposited on a copper foil by flame spraying, and so forth. The coefficients of thermal expansion of these substrates are 10 (ppm/K) or less in the planar directions thereof (in the direction of each substrate within the bonding surface thereof). The ceramics-based substrates, however, are problematic in their drillabilities in the case of forming through-holes. Meanwhile, regarding organic substance based substrates, it has been known that the coefficient of thermal expansion can be reduced by mixing an inorganic filler into a resin system. This contrivance, however, results in enlarging the elastic modulus of the substrate and is not always satisfactory for attaining lower stresses.

It has heretofore been known that a lower elastic modulus can be achieved by adding a rubber type component into the resin component of a laminate material (Japanese Patent Application Laid-open No. 100446/1986). In this case, a flexible substrate of excellent toughness is provided by rendering the resin and rubber type components miscible. This contrivance is really effective to reduce the elastic modulus of the substrate, but it tends to enlarge the thermal expansion coefficient thereof.

It has also been known to apply to a laminate the combination of a matrix resin component and another resin component which exhibits an inferior miscibility with the matrix as represented by a so-called "sea-island structure" (a phase separation structure in which a continuous matrix contains another phase (dispersed islands) existing in an independent state. The island portion is dispersed portion, and the sea portion is continuous matrix portion). As an example of such a laminate, there has been proposed a substrate in which a layer made of the resin components of the sea-island structure is formed in only the surface of the substrate, thereby attaining a lower elastic modulus and reducing thermal stresses in the case of packaging semiconductor elements on the laminate (Japanese Patent Application Laid-open No. 356995/1992). With this method, however, it is difficult to reduce the coefficient of thermal expansion of the substrate in the planar direction thereof and it has a slight effect on the characteristics of the whole substrate.

Semiconductor elements have been changed to higher integration and higher function, such as from LSI to VLSI, ULSI, and consequently elements become large in size, many in pins, fast in operating speed, much in consuming electric power.

To cope with more pins, it becomes practical to employ a grid array structure in which a connecting terminal array is provided on a mounting surface by using a multi-layered carrier substrate.

The grid array structure employs a ball grid array structure which has short length connecting terminals to realize high speed signal propagation. The ball structure as connecting terminal is effective for lower its inductance because the conductor width can be thickened. In recent years, in order to further increase the transmission speed, it is proposed that an organic material having low dielectric constant is used for the carrier substrate U.S. Pat. No. 5,216,278).

However, since thermal expansion coefficient of organic materials are usually larger than that of semiconductor element, there is a problem in connecting reliability due to thermal stress caused by difference of thermal expansion coefficients between them.

SUMMARY OF THE INVENTION

The present invention has for its object to provide a laminate, a multilayer printed circuit board and a prepreg each of which exhibits low thermal stresses owing to a small thermal expansion coefficient and a low elastic modulus, and electronics products employing any of them.

An object of the present invention is to provide a resin encapsulated type semiconductor device and a semiconductor mounting device with a resin encapsulated type semiconductor device having high connecting reliability in which an organic material is used as their carrier substrates in semiconductor devices having a ball grid array structure.

In order to accomplish the aforementioned object, the present invention consists in the following expedients:

The first of the expedients is a laminate capable of mounting semiconductor elements thereon; comprising an insulating layer which is constituted by a resin portion of sea-island structure and a woven reinforcement, and which exhibits a coefficient of thermal expansion of 3.0~10 (ppm/K) in a planar direction thereof and a glass transition temperature of 150~300 (°C.).

The second expedient is a multilayer printed circuit board capable of mounting semiconductor elements thereon; comprising at least two insulating layers each of which is constituted by a resin portion of sea-island structure and a woven reinforcement, and each of which exhibits a coefficient of thermal expansion of 3.0~10 (ppm/K) in a planar direction thereof and a glass transition temperature of 150~300 (°C.).

The third expedient is a laminate capable of mounting semiconductor elements thereon; comprising an insulating layer which is constituted by a resin portion of sea-island structure, an inorganic filler and a woven reinforcement, and which exhibits a coefficient of thermal expansion of 3.0~10 (ppm/K) in a planar direction thereof and a glass transition temperature of 150~300 (°C.).

The fourth expedient is a multilayer printed circuit board capable of mounting semiconductor elements thereon; comprising at least two insulating layers each of which is constituted by a resin portion of sea-island structure, an inorganic filler and a woven reinforcement, and each of which exhibits a coefficient of thermal expansion of 3.0~10 (ppm/K) in a planar direction thereof and a glass transition temperature of 150~300 (°C.).

The fifth expedient is a prepreg wherein a woven reinforcement is impregnated with a resin component; comprising the fact that said resin component includes a resin portion of sea-island structure, and that the prepreg after having been set exhibits a coefficient of thermal expansion of 3.0~10 (ppm/K) in a planar direction thereof and a glass transition temperature of 150~300 (°C.).

The sixth expedient is a prepreg wherein a woven reinforcement is impregnated with a resin component; comprising the fact that said resin component includes a resin portion of sea-island structure and an inorganic filler at an average grain diameter of 0.1~15 (μm), and that the prepreg after having been set exhibits a coefficient of thermal expansion of 3.0~10 (ppm/K) in a planar direction thereof and a glass transition temperature 150~300 (°C.).

The seventh expedient is a memory card wherein a memory element is mounted on a circuit board by surface packaging; comprising the fact that said circuit board includes an insulating layer which is constituted by a resin portion of sea-island structure and a woven reinforcement, and which exhibits a coefficient of thermal expansion of 3.0~10 (ppm/K) in a planar direction thereof and a glass transition temperature of 150~300 (°C.).

The eighth expedient is a computer which has a multilayer printed circuit board capable of mounting semiconductor elements thereon; comprising the fact that said multilayer printed circuit board includes an insulating layer which is constituted by a resin portion of sea-island structure and a woven reinforcement, and which exhibits a coefficient of thermal expansion of 3.0~10 (ppm/K) in a planar direction thereof and a glass transition temperature of 150~300 (°C.), and that a signal transmission delay time of said computer is 1~15 (ns/m).

The ninth expedient is a communication equipment which has a circuit board capable of mounting semiconductor elements thereon; comprising the fact that said circuit board includes an insulating layer which is constituted by a resin portion of sea-island structure and a woven reinforcement, and which exhibits a coefficient of thermal expansion of 3.0~10 (ppm/K) in a planar direction thereof and a glass transition temperature of 150~300 (°C.), and that a weight of said communication equipment is 10 (g)~30 (kg).

The tenth expedient is an electronics equipment which has a circuit board capable of mounting semiconductor elements thereon; comprising the fact that said circuit board includes an insulating layer which is constituted by a resin portion of sea-island structure and a woven reinforcement, and which exhibits a coefficient of thermal expansion of 3.0~10 (ppm/K) in a planar direction thereof and a glass transition temperature of 150~300 (°C.), and that a total volume occupied by said semiconductor elements and said circuit board is 1~50 (%) with respect to a volume of the whole electronics equipment.

The eleventh expedient is a laminate wherein at least one prepreg or sheet which is constituted by a resin and a woven reinforcement is stacked and bonded; comprising the fact that said woven reinforcement is constructed so as to exhibit an anisotropy as a physical property, and that said resin is in the form of a continuous layer which has a sea-island structure and which prevents the layers of woven reinforcement from coming into contact with each other.

The twelfth expedient is a laminate wherein at least one prepreg or sheet which is constituted by a resin and a woven reinforcement is stacked and bonded; comprising the fact that said woven reinforcement is constructed so as to exhibit an anisotropy as a physical property, that said resin is in the form of a continuous layer which has a sea-island structure and which prevents the layers of woven reinforcement from coming into contact with each other, and that said laminate exhibits a coefficient of thermal expansion of 3.0~10 (ppm/K) in a planar direction thereof and a glass transition temperature of 150~300 (°C.).

The 13th expedient is as follows. In a resin encapsulated type semiconductor device covered with a resin encapsulating material at least a mounting portion of a carrier substrate mounting a semiconductor element, the mounting surface of said carrier substrate having a connecting terminal formed of a solder ball grid, said carrier substrate is a laminated plate made of an organic material and a reinforced material, thermal expansion coefficient of the laminated plate in a planer direction and thermal expansion coefficient of said resin encapsulating material being 3 to 10 ppm/K, the difference between both of the thermal expansion coefficients being smaller than 3 ppm/K.

The 14th expedient is as follows. The organic material forming said carrier substrate is an organic material having phase separation structure.

The present invention is characterized in that the organic material composing said carrier substrate has phase separation structure, and particularly has a low thermal expansion coefficient on a planar direction.

The thermal expansion coefficient in a planar direction in the present invention means the thermal expansion coefficient in the adhering surface in a laminated plate. There are three kinds of the thermal expansion coefficients in the adhering surface; thermal expansion coefficient in X-direction in which a tension force acts on the reinforcing material in coating process during prepreg fabricating, thermal expansion coefficient in Y-direction intersecting with the X-direction at right angle, and thermal expansion coefficient in bias direction inclining to the two directions at 45 degree. The magnitudes of these thermal expansion coefficients generally become as follows: thermal expansion coefficient in bias direction > thermal expansion coefficient in Y-direction > thermal expansion coefficient in X-direction. Therefore, the effects on the reinforcing material and the laminating adhesion in the bias direction are the smallest. The thermal expansion coefficient in a planar direction in the present invention is defined as the thermal expansion coefficient in the bias direction.

The elastic modulus of the organic material having phase separation structure becomes low. Therefore, the glass cloth as low thermal expansion component of the complex material can be increased to contribute as a matrix against the thermal expansion coefficient in a planar direction. Since the elastic modulus of the laminated plate is small compared to that of a laminated plate without phase separation structure, the thermal stress generated in the laminated plate can be decreased.

The phase separation structure described above means a structure in which the matrix insulating layer is composed of two or more structural compositions having different components, for example, island-structure morphology. There are two kinds of such morphology; morphology in a thermodynamic stable state and morphology in a kinetic meta-stable state due to high viscosity of the matrix.

The resin material having such a phase separation structure is substantially effective to decrease thermal expansion coefficient and to decrease elastic modulus for the organic material of carrier substrate. Such a resin composition can he obtained by mixing or copolymerizing two or more components having poor miscibility with each other.

The phase separation state of the phases above may be either in a thermodynamic stable state or in a kinetic meta-stable state due to high viscosity of the matrix.

As for the matrix resin described above, there are thermoset resins such as epoxy resin, unsaturated polyester resin, epoxy-isocyanate resin, maleimide resin, maleimide-epoxy resin, cyanate-ester resin, cyanate-ester-epoxy resin, cyanate-ester-maleimide resin, phenolic resin, diallyl-phthalate resin, urethane resin, cyanamide resin or maleimide-cyanamide resin.

As for the organic components immiscible with the above resin and capable of forming the phase separation structure, there are, for example, a polymer of a silicon-containing compound, a fluorine-containing compound and these compounds. As for the typical silicon-containing compounds, there are organo-siloxane and organo-poly-siloxane having amino group, carboxyl group, epoxy group, hydroxy group, pyrimidine group, carboxylic group in end group or in side chain.

As for the typical fluorine-containing compounds, there are perfluoro-ether, poly-tetrafluoro-ethylene (PTFE), copolymer of poly-tetrafluoro-ethylene and perfluoro-alkylvinyl-ether (PFA), copolymer of tetrafluoro-ethylene and hexafluoro-propane (FEP), polychloro-trifluoro-ethylene (PCTFE), copolymer of ethylene and tetrafluoro-ethylene (ETFE), copolymer of ethylene and chloro-trifluoro-ethylene (ECTFE), polyvinylidene fluoride (PVDF), polyvinyl fluoride (PVF) having amino group, carboxyl group, epoxy group, hydroxy group, pyrimidine group, isocyanate group, carboxylic group in end group or in side chain. The molecular weight of the above polymers is preferably 1000 to 1000000.

As for the encapsulating material in the present invention, there is generally used a molding compound having the main components of epoxy resin component, silicon group resin component, maleimide group resin component and melted silica filler (spherical silica particles manufactured by melting silica powder through spray drying method). By changing mixing ratio of the melted silica filler, the thermal expansion coefficient of the encapsulating material can be adjusted.

The carrier substrate according to the present invention is capable of providing a ground layer inside the substrate by being constructed in multi-wiring layer, decreasing concurrent switching noise in high speed computing process which will be effective for a package of a high speed semiconductor device having clock frequency more than 100 Mhz in the future.

A semiconductor device having a carrier substrate according to the present invention is high in processing speed due to low noise, low inductance and short wiring length, and is high in mounting reliability through grid array structure of multi-pin due to low thermal stress by low elastic modulus and low thermal expansion coefficient of carrier substrate.

The 15th expedient is as follows. In a semiconductor mounting device mounting on a mounting substrate at least one of resin encapsulated type semiconductor devices covered with a resin encapsulating material at least a mounting portion of a carrier substrate mounting a semiconductor element, the mounting surface of said carrier substrate having a connecting terminal formed of a solder ball grid, said carrier substrate and said mounting substrate are laminated plates made of an organic material and a reinforced material, thermal expansion coefficient of the laminated plates in a planar direction and thermal expansion coefficient of said resin encapsulating material being 3 to 10 ppm/K, the difference among the three of the thermal expansion coefficients being smaller than 3 ppm/K.

The 16th expedient is as follows. The organic material forming said carrier substrate and said mounting substrate is an organic material of phase separation structure.

The mounting substrate has a laminated plate composed of an organic material for insulating layers and fiber reinforcing material such as glass cloth similar to the carrier substrate. By using an organic material having phase separation structure, the thermal expansion coefficient and elastic modulus in as planer direction can be decreased and a semiconductor mounting device having high connecting reliability can be provided. In the present invention, a solder ball grid is used as the means for mounting the semiconductor element to a carrier substrate and connect to the carrier substrate and to a mounting substrate.

It is possible to realize high speed signal propagation by using a low dielectric material for the mounting substrate.

The stress between the semiconductor element and the carrier substrate can be decreased by forming a multi-wiring layer on the semiconductor element, forming bump wiring for the ball grid in the outmost layer, employing the ball grid array type and the multi-wiring layer having a low elastic modulus.

In the past, the fabricating process and the fabricating apparatus for the semiconductor device have been complex since wire bonding method is employed for connecting to the semiconductor element and ball grid array structure is employed for connecting to the mounting substrate. In the present invention, since the ball grid array structure is employed for connecting to the both, the present invention has an advantage in this point.

Since the length of connecting wire in the ball grid array structure is shorter than that in the wire bonding method, the inductance is lowered and the processing speed is increased. Further, it is easy to form the multi-pin since the terminals can be extracted from the whole surface.

As for the method of forming multi-wiring layer on the semiconductor element, there are the sequentially multi-wiring layer method where patterning of insulating layer and vapor deposition are alternatingly performed, the multi-layer method of substrates having wiring film and so on, but it is not limited to these.

The present invention can be applied to the semiconductor element which is formed IC, LST such as memory, logic, gate array, custom, power transistor on a semiconductor wafer such as Si, GaAs and has connecting terminals such as lead terminals and bump terminals.

In the present invention, a "semiconductor element" is an element in which an IC (integrated circuit) or LSI (large-scale integrated circuit) including, for example, a memory, a logic circuit, a custom IC or/and a power transistor is formed on a wafer made of a semiconductor such as Si (silicon) or GaAs (gallium arsenide), and which has terminals for connecting the IC or LSI to leads, bumps etc. The elements shall include, not only bare chips, but also packaged chips in the state in which the element is covered or encapsulated with a resin or ceramics, in the state in which the element has been subjected to tape automatic bonding (TAB), and so forth.

Also in the present invention, a "laminate" is a structural product or member which is fabricated in such a way that at least one piece of prepreg, sheet or the like which has been obtained by impregnating a woven reinforcement with a resin component is layered, and that the layer is pressed, bonded and molded. By way of example, the woven reinforcements include a piece of cloth or sheet which is made of inorganic type fiber glass of (such as E glass (electrical glass), S glass (structural glass), D glass (dielectric glass) or Q glass (quartz glass)), titanium or the like; a piece of cloth or sheet which is made of organic type fiber of polyamide, polyamideimide, polyimide, a liquid-crystalline polymer, aromatic polyamide or the like; a piece of cloth which is made of surface insulated carbon fiber; and a piece of cloth or sheet which is made of at least two kinds of fiber selected from among the inorganic type fiber, organic type fibers and surface insulated carbon fibers mentioned above. Besides, for such a purpose of enhancing an electromagnetic-wave shielding property, a radiation resistance or a mechanical strength or bestowing an electric conductivity, it is possible to use a piece of cloth or sheet which is made of surface insulated metal fiber or a piece of cloth or sheet which is made of a composite system consisting of surface insulated metal fiber and at least one kind of fiber selected from among inorganic type fiber, organic type fiber and surface insulated carbon fiber.

Also in the present invention, a "multilayer printed circuit board" is a wired circuit board for mounting semiconductor elements thereon, which is formed with at least two wiring layers that are connected by means of through-holes etc. Examples of the wiring layers bear circuits which are formed from foils of metals or by plating with or vacuum evaporation of metals. The metals are copper, silver, gold, aluminum, chromium, molybdenum, tungsten, etc. Especially, copper is preferable, and the copper foil is recommended.

Further, a resinous varnish for impregnating the woven reinforcement in the present invention accounts for about 30~90 (weight-%) in terms of the solid matter content of the varnish with respect to the total weight of both the varnish and the woven reinforcement (that is, the woven reinforcement accounts for about 70~10 (weight-%) with respect to the total weight). When the proportion of the varnish is smaller, a good prepreg or film is difficult to obtain. On the other hand, when the proportion of the varnish is larger, in is difficult to make the coefficient of thermal expansion of the laminate in the planar direction thereof fall within a range of 3.0~10 (ppm/K). Besides, the effect of reinforcing the laminate decreases.

The laminate according to the present invention is well suited to wiring uses such as, for example, a flexible wiring circuit board and an insulating film to intervene between circuits. By way of example, the flexible wiring circuit board is manufactured as stated below.

First, a piece of glass cloth is impregnated with a varnish which has been prepared by dissolving a resin composite in an organic solvent. Subsequently, while the solvent is vaporized in a drying oven, a setting reaction is somewhat advanced to form a prepreg at B-stage (in the semi-set state in which the prepreg melts when heat is applied thereto). At the next step, metal foils such as copper foils or aluminum foils are superposed on both the surfaces of the prepreg so as to sandwich the prepreg therebetween. Alternatively, such a metal foil is superposed on only one surface of the prepreg. In this state, each metal foil is bonded by thermocompression, and the impregnating resin composite is set at the same time. Next, the surface of the metal foil (copper foil) is coated with resist ink in the shape of a circuit, and the resist ink is dried. Next, the parts of the copper foil except the circuit are etched with, e.g., an aqueous solution of ferric chloride. Subsequently, using an organic solvent such as methylene chloride, the resist ink is removed, and the resulting structure is washed. Lastly, the resulting structure is dipped into a soldering bath so as to stick solder to pertinent parts. Then, the circuit is finished.

For such intended uses, the flexible substrate or flexible circuit board of the present invention is generally put on the market in the semi-set state (as the prepreg) or in the set state after the thermocompression bonding of the metal foil or foils. The flexible substrate or circuit board in the present invention shall include articles in both the semi-set state and the set state.

Incidentally, the multilayer printed circuit board according to the present invention can also be fabricated as stated below. A printed-wiring circuit board already formed with a circuit is coated with a varnish prepared by dissolving a resin component in a solvent. Subsequently, while the solvent is vaporized in a drying oven, the varnish is somewhat set into the B-stage (into the semi-set state). Thereafter, a metal foil such as copper foil or aluminum foil is superposed on the outer surface of the semi-set resin component, and thermocompression is carried out to bond the metal foil and set the resin component. Further, another circuit is formed by the necessary steps of the method explained above.

In the present invention, the impregnation of a woven reinforcement with a resin can be effected in such a way that a resin solution (varnish) is applied to the woven reinforcement once or a plurality of times by the use of a conventional impregnating-and-coating machine of horizontal type or/and vertical type. Alternatively, the impregnating process can be performed by coating one surface or both surfaces of the woven reinforcement with the resin. Further, the impregnating process can be performed in such a way that a solid resin sheet is superposed on the woven reinforcement beforehand, and that the resulting woven reinforcement is heated and/or molded. If a prepreg or the impregnating sheet after having been dried is tacky, a mold releasing sheet can be used voluntarily at a suitable step. Usable as the mold releasing sheet is cellulosic paper or film coated with a mold releasing agent, polypropylene film, polyvinyl alcohol film, or the like.

In the present invention, a "resin portion of sea-island structure" is made from a resin composite which consists of at least two kinds of substances (e.g., a resin and a compound, or resins) being inferiorly miscible to each other, or from a resin composite which contains a resin of phase separation type, such as a polymer produced by copolymerizing components of inferior miscibility. In the resin composite, one component should desirably have a lower elastic modulus than the other component or components. The resin composite to be selected and used is a composite which has the sea-island structure and in which at least one of components conjointly employed is immiscible with the other component or components.

Mentioned as the resins of the resin composites various thermosetting resins, for example, an epoxy resin, an unsaturated polyester resin, an epoxy-isocyanate resin, a maleimide resin, a maleimide-epoxy resin, a cyanate ester resin, a cyanate ester-epoxy resin, a cyanate ester-maleimide resin, a phenolic resin, a diallylphthalate resin, an urethane resin, a cyanamide resin and a maleimide-cyanamide resin.

By way of example, silicon-containing compounds, fluorine-containing compounds, and the polymers of these compounds are mentioned as the compounds and resins which are immiscible with the aforementioned thermosetting resins and which form the sea-island structures when mixed with these thermosetting resins. Typical examples of the silicon-containing compounds are organosiloxane and organopolysiloxane each of which has at its terminals or its side chains, functional groups such as amino groups, carboxyl groups, epoxy groups, hydroxyl groups, pyrimidinyl groups or carboxylic groups. Typical examples of the fluorine-containing compounds are perfluoroether, PTFE (polytetrafluoroethylene), PFA (tetrafluoroethylene perfluoroalkyl vinyl ether copolymer), FEP (tetrafluoroethylene hexafluoropropene copolymer), PCTFE (polychlorotrifluoroethylene), ETFE (ethylene tetrafluoroethylene copolymer), ECTFE (ethylene chlorotrifluoroethylene copolymer), PVDF (polyvinylidene difluoride) and PVF polyvinyl fluoride) each of which has at its terminals or its side chains, functional groups such as amino groups, carboxyl groups, epoxy groups, hydroxyl groups, pyrimidinyl groups, isocyanic groups or carboxylic groups. Each of the polymers of the specified compounds should preferably have a molecular weight of $10^3$~$10^6$. Such a polymer is effective to lower the elastic modulus.

In the present invention, the aforementioned resin composites of high heat resistances are especially favorable in order that the insulating layer of a laminate or a multilayer printed circuit board, a prepreg, etc. may exhibit glass transition temperatures falling within a range of 150~300 (°C.) (the reasons for the specified range will be explained below). Besides, in the present invention, the aspect of the immiscibility may be either of a nonreactive type or a reactive type, but the reactive type is favorable from the viewpoint of bestowing the high heat resistances. By way of example, in the case of a resin composite which consists of an epoxy compound and a silicon-containing compound, the silicon-containing compound and the epoxy compound which have groups being reactive with epoxy groups or hydroxyl groups can be previously reacted in a solution at the preparation of a varnish. On this occasion, it is also possible to add a setting agent, an inorganic filler and/or a coupling agent.

In the present invention, the glass transition temperature of the insulating layer should preferably fall within the range of 150~300 (°C.). In the case of a glass transition temperature below 150 (°C.), it becomes difficult to satisfactorily clear the reliability tests (for example, a high-temperature shelf test and a heat cycle test) of the product such as the laminate or the multilayer printed circuit board. On the other hand, in the case of a glass transition temperature above 300 (°C.), the bestowal of the flexibility is difficult, so that the problems of cracking and inferior molding characteristics are involved in the product.

Further, in the present invention, the coefficient of thermal expansion in the planar direction should preferably fall within a range of 3.0~10 (ppm/K). The coefficient of thermal expansion of a semiconductor element (for example, made from silicon) is 3.0~4.0 (ppm/K). Also, the coefficient of thermal expansion of an encapsulating resin in a resin-molded semiconductor device is, only slightly greater than the value of silicon. In order to enhance the reliability of the connections between the semiconductor element and a laminate (or a multilayer printed circuit board), it is effective to reduce thermal stresses which arise between both the members or articles. To this end, the difference between the thermal expansion coefficients of the laminate and the semiconductor element can be rendered small in such a way that the coefficient of thermal expansion of the laminate (or the multilayer printed circuit board) in the planar direction thereof is brought into the range of 3.0~10 (ppm/K). Moreover, since the construction of the multilayer printed circuit board according to the present invention does not include ceramics as its constituent, it can lower the coefficient of thermal expansion. Accordingly, the following effects are brought forth:

(1) The multilayer printed circuit board exhibits a superior drillability.

(2) The connection reliability of through-holes in the multilayer printed circuit board is high owing to the superior close adhesion of the circuit board with a plated metal.

(3) The multilayer printed circuit board can be made lighter in weight.

(4) Since a lower elastic modulus can be attained simultaneously with the lower coefficient of thermal expansion, a large number of electrical parts having different thermal expansion coefficients can be mounted on the identical surface of the multilayer printed circuit board. The differences of the thermal expansion coefficients can be covered or hidden by the lower elastic modulus.

(5) A substrate or circuit board of large area can be manufactured by the same techniques as in the prior art.

According to the present invention, various electrical parts such as semiconductor elements can be mounted by surface packaging by employing a circuit board which is constituted by a resin portion and a woven reinforcement, the resin portion having a sea-island structure and exhibiting a coefficient of thermal expansion of 3.0~10 (ppm/K) in a planar direction thereof, as well as a glass transition temperature of 150~300 (°C.). Thus, the circuit board is superior in drillability to a ceramics-containing substrate which is a prior-art substrate of low thermal expansion for the surface packaging, and it is very effective for the reliability of through-holes because the close adhesion thereof with a plated metal is more intense than that of ceramics. In general, a ceramics-based circuit board is less bondable with a resin, and it therefore poses a problem with regard to the reliability of the interface between the circuit board and the resin.

In contrast, such an interface of different phases does not exist in the circuit board according to the present invention. It is accordingly possible to provide a memory card of high reliability. Moreover, the circuit board according to the present invention does not contain ceramics, and the sea-island structure of its resin portion results in a lower elastic modulus compared with an unmodified state. Therefore, even when various electrical parts having unequal thermal expansion coefficients are to be mounted together on the circuit board, thermal stresses which arise at a mounting step are of small magnitude. It is accordingly possible to provide a multifunctional memory card of superior connection reliability.

Besides, the thermal expansion coefficient of a thin package for semiconductor elements of high integration density is nearly equal to that of silicon and is 6 (ppm/K) or so. The semiconductor elements of high integration density having low thermal expansion coefficients are therefore permitted to be mounted densely by surface packaging while the connection reliability is kept high, by employing a circuit board which is constituted by a resin portion and a woven reinforcement, the resin portion having a sea-island structure and exhibiting a coefficient of thermal expansion of 3.0~10 (ppm/K) in a planar direction thereof, as well as a glass transition temperature of 150~300 (°C.). Thus, signal transmission distances can be shortened, and a computer of high arithmetic processing speed in which signal transmission delay times are 1~15 (ns/m) can be provided. Moreover, since a reduced size and a lightened weight are attained by the dense packaging, a computer of superior portability can be provided.

According to the present invention, a reduced size and a lightened weight of 10 (g)~30 (kg) can be attained to provide a communication equipment of superior portability in such a way that electrical parts such as semiconductor elements are mounted at a high integration density by surface packaging, by employing a circuit board which is constituted by a resin portion and a woven reinforcement, the resin portion having a sea-island structure and exhibiting a coefficient of thermal expansion of 3.0~10 (ppm/K) in a planar direction thereof, as well as a glass transition temperature of 150~300 (°C.). Typical examples of the communication equipment are a portable telephone set and a portable radio equipment. Further, the sea-island substrate is lighter in weight than a ceramics-containing substrate. Still further, compared with the elastic modulus of the ceramics-containing substrate or an unmodified substrate, that of the sea-island substrate is lowered considerably. Therefore, even when various electrical parts having unequal thermal expansion coefficients are to be mounted together on the circuit board, thermal stresses which arise at a mounting step are of small magnitude, and a communication equipment of superior connection reliability can be provided. Accordingly, multifarious communication equipments can be fabricated in accordance with purposes.

According to the present invention, it is possible to provide a car electronics equipment including electrical parts such as semiconductor elements, which equipment can reduce the occupying volume of its packaging portion (concretely, a total volume to be occupied by the semiconductor elements and a circuit board can be made 1~50 (%) with respect to the volume of the whole electronics equipment) and can endure a high-temperature and high-humidity environment such as an engine room, in such a way that the electrical parts such as semiconductor elements are mounted at a high integration density by surface packaging, by employing the circuit board which is constituted by a resin portion and a woven reinforcement, the resin portion having a sea-island structure and exhibiting a coefficient of thermal expansion of 3.0~10 (ppm/K) in a planar direction thereof, as well as a glass transition temperature of 150~300 (°C.). Typical examples of such a car electronics equipment are an engine control device and a navigation device. It is necessary for these devices to be installed in limited places having severe environmental conditions. To this end, the equipment which employs the circuit board constituted by the resin portion of the sea-island structure can achieve a reduced size by the dense packaging. Moreover, since the circuit board does not contain any ceramics material, it has few interfaces of different phases and exhibits a superior connection reliability. Accordingly, the circuit board is well suited for use in the field of car electronics.

As for the carrier substrate according to the present invention, a laminated plate composed of organic material and fiber reinforcing material such as glass cloth is used. The laminated plate can be obtained by laminating, heating and pressing prepreg sheets of the fiber reinforcing material impregnated with resin component.

As for the above reinforcing materials, there are cloth or sheet made of non-organic fiber such as glass (E-glass, S-glass, D-glass, Q-glass), titanium and so on; cloth or sheet made of polyamide, polyamideimide, polyimide, liquid-crystal polymer, aromatic amide; cloth or sheet made of surface insulated carbon fiber or complex material of these.

As for the mounting substrate, it is preferable to use the same material as used for the carrier substrate.

There are two methods of jointing the semiconductor element and the carrier substrate in the present invention one is a method where the terminals formed on one side of the surface of the semiconductor element and the pads formed on the surface of the carrier substrate to mount element are connected with wire bonding. However, more effective method is that pad array structure is formed on the semiconductor element, and said pad array structure and the pad array structure formed on the surface of the carrier substrate to mount the element are connected with bump. This method provides good signal propagation characteristic because of short connection length and good multi-pin capability because of usability of the whole surface of the element.

In order to form pad array structure on the semiconductor element, multi-wiring structure is formed on the semiconductor element. Since the organic material provided as the multi-wiring structure generally has a low dielectric constant comparing to non-organic materials, speed of signal propagation can be made fast. Further, since the elastic modulus is low and has a stress modulating effect, it is possible to keep connecting reliability even using rigid bump comparing to wire. From the standpoint of workability and thermal resistivity, it is preferable to employ, for example, polyimide, epoxy resin, cyanate-bis-maleimide resin and so on.

As for various conductive films, copper, silver, aluminum, molybdenum and so on may be used. However, from the standpoint of high speed transmission, reliability and cost, copper is preferable.

In operation, in a laminate which has a resin and a reinforcement, the present invention puts the components of a resin composite into a sea-island structure, namely, a phase separation structure, whereby the thermal expansion coefficient and elastic modulus of the resin composite can be simultaneously reduced. As an example of a mechanism for the manifestation of the phase separation structure, in a case where the phase separation resin of the resin composite has an island structure of low elastic modulus, the resin of the resin composite as a matrix layer will have its elastic modulus reduced owing to a moldability added by the island modulus reduced owing to a moldability added by the island parts of the island structure. Regarding the coefficient of thermal expansion of the resin composite in the planar direction of the laminate, it is considered that the thermal expansion of the matrix resin will crush the island parts, with the result that the thermal expansion of the whole resin composite will decrease apparently. Other phase separation structures can simultaneously reduce both the characteristics through various manifestative mechanisms.

Not all of the manifestative mechanisms have yet been satisfactorily made clear.

In the present invention, the thermal expansion coefficients of the carrier substrate and the encapsulating material can be effectively decreased by using materials having thermal expansion coefficients within the range of 3 to 10 ppm/K both in a planar direction of the carrier substrate and in the encapsulating material. As for the carrier substrate, the characteristics of low elastic modulus and low thermal expansion coefficient can be obtained by using glass cloth or the like as a reinforcing material and by using a laminated plate having phase separation structure as a matrix organic material. Thereby, the generated thermal stress can be decreased and the mounting reliability can be substantially improved.

Further, it is possible to provide a structure having further high connecting reliability by controlling the thermal expansion coefficient of each material including the substrate mounting semiconductor device.

Furthermore, it is possible to attain an improved electric characteristic suitable for high speed propagation and a multi-pin structure by providing multi-wiring layer on the semiconductor element and by performing bump connection of the multi-wiring layer to the carrier substrate using a grid array structure.

PREFERRED EMBODIMENTS OF THE INVENTION

Figure 1:
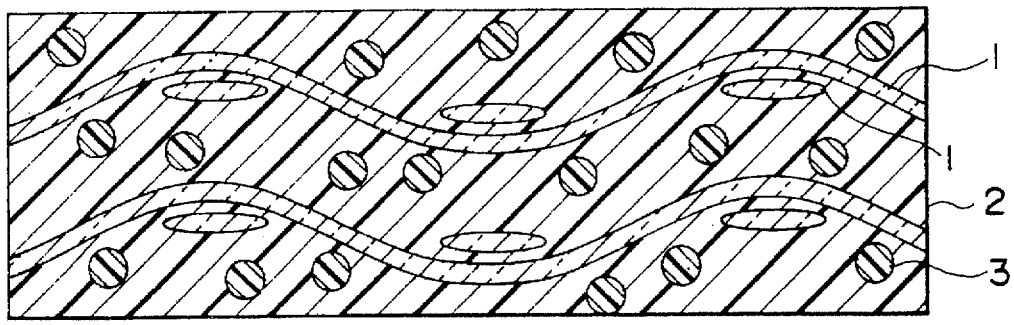
FIG. 1 is a model diagram showing the section of a laminate according to the present invention.

Now, the present invention will be described in detail in conjunction with examples.

(Example 1)

88 parts (by weight) of phenol-novolak resin (trade name "XL225-3L", produced by Mitsui Toatsu Chemicals, Inc.) as a setting agent and 10 parts (by weight) of amine-modified dimethylsiloxane ("PS513", Chisso Corporation) as a component of low elastic modulus were added to 100 parts (by weight) of epoxy compound ("EXA-1514", Dai-Nippon Ink and Chemicals, Inc.) in methyl ethyl ketone. Thus, a varnish which had a solid matter content of 50 (weight-%) was prepared. A piece of E-glass (electrical glass) cloth 100 (μm) thick was impregnated and coated with the varnish, and then dried at 120 (°C.) for 10 (min) so as to remove the solvent. Thus, a piece of prepreg was obtained. The resin content of the obtained prepreg was 70 (weight-%).

Copper foils (each being 18 (μm) thick) were respectively superposed on both the surfaces of the obtained prepreg, and the resulting structure was pressed under heat by a press. Thus, a laminate was obtained. As pressing conditions on this occasion, two-stage reactions at 130 (°C.) for 30 (min) and at 180 (°C.) for 60 (min) were performed, and a pressure of 20 (kg/cm²) was held. The copper foil peeling strength of the obtained laminate, and the thermal expansion coefficient of the laminate in the planar direction thereof after having etched the copper foils were evaluated by the TMA (Thermal Mechanical Analyzer) method. Besides, in order to measure the elastic modulus of the resin portion Of the laminate, resin powder was scratched off the prepreg, and a resin sheet was fabricated from the resin powder under the same pressing conditions as those of the laminate. The sample of the resin sheet had its elastic modulus at room temperature evaluated by a viscoelastic measurement.

(Example 2)

Resin components were prescribed in such a way that 55 parts (by weight) of phenol-novolak (trade name "H100", produced by Hitachi Chemical Co., Ltd.) as a setting agent and 15 parts (by weight) of epoxy-modified polydimethylsiloxane ("SF8413", Toray Silicone Co., Ltd.) as a component of low elastic modulus were added to 100 parts (by weight) of epoxy compound ("YX4000H", Yuka Shell Kabushiki-Kaisha). On this occasion, the setting agent and the component of low elastic modulus were reacted at 90 (°C.) for 30 (min) in methyl isobutyl ketone beforehand as a pre-reaction, and the resulting solution was cooled down to room temperature. Thereafter, the epoxy compound was added into the cooled solution. Thus, a varnish which had a solid matter content of 50 (weight-%) was prepared. A piece of S-glass (structural glass) cloth 70 (μm) thick was impregnated and coated with the prepared varnish, and then dried at 140 (°C.) for 10 (min) so as to remove the solvent. Thus, a piece of prepreg was obtained.

A laminate and a resin sheet were fabricated from the obtained prepreg by the same methods as in Example 1, and their characteristics were similarly estimated.

(Example 3)

Resin components were prescribed as consisting of 100 parts (by weight) of maleimide compound (bis (4maleimidophenyl) methane, produced by Mitsui Toatsu Chemicals, Inc.), 38 parts (by weight) of amine compound (2, 2-bis(4-(4-aminophenoxy) phenyl) propane, Wakayama Fine Chemical Co.) and 5 parts (by weight) of amine-modified polydimethylsiloxane (trade name "SF8418", Toray Silicone Co., Ltd.). On this occasion, pre-reactions were so performed that 50 parts (by weight) of the maleimide compound and the amine-modified polydimethylsiloxane were reacted in dimethylformamide at 110 (°C.) for 20 (min), and that the remaining 50 parts (by weight) of the maleimide compound and the amine compound were added into the resulting solution and were reacted for 20 (min). Thus, a varnish which had a solid matter content of 40 (weight-%) was prepared. Further, 20 parts (by weight) of fused silica filler (at an average grain diameter of 10 (μm)) were mixed and dispersed into the prepared varnish. A piece of D-glass (dielectric glass) cloth 80 (μm) thick was impregnated and coated with the resulting varnish, and then dried at 140 (°C.) for 5 (min) and at 145 (°C.) for 5 (min) so as to remove the solvent. Thus, a piece of prepreg was obtained.

A laminate was fabricated from the obtained prepreg by a method similar to that in Example 1, and its characteristics were similarly estimated. The molding conditions of the laminate were 130 (°C.) for 30 (min) and 200 (°C.) for 60 (min).

(Example 4)

Resin components were prescribed in such a way that 72 parts (by weight) of orthocresol novolak (trade name "OCN7000", produced by Nihon Kayaku Kabushiki-Kaisha) as a setting agent and 10 parts (by weight) of both-terminal carboxylic acid-modified perfluoroether ("ZDIAC-2000", Monte Ferrous Inc.) as a component of low elastic modulus were added to 100 parts (by weight) of epoxy compound ("YX4000H", Yuka Shell Kabushiki-Kaisha). On this occasion, 1 part (by weight) of imidazole ("2E4MZ", Shikoku Kasei Kabushiki-Kaisha) was added as a setting accelerator. Using acetone as a solvent, a varnish which had a solid matter content of 60 (weight-%) was prepared. A piece of polyamide cloth 70 (μm) thick was impregnated and coated with the prepared varnish, and then had the solvent removed by drying stages at 110 (°C.) for 10 (min) and at 120 (°C.) for 15 (min). Thus, a piece of prepreg was obtained.

A laminate was fabricated from the obtained prepreg by a method similar to that in Example 1, and its characteristics were similarly estimated. The molding conditions of the laminate were 130 (°C.) for 30 (min) and 200 (°C.) for 60 (min).

(Comparative Example 1)

A laminate and a resin sheet, each of which included a homogeneous resin portion having no sea-island structure, were fabricated using the materials of Example 1 except polydimethylsiloxane, that is, using the epoxy compound and the phenolic setting agent. The characteristics of the laminate and the resin sheet were estimated.

(Comparative Example 2)

A laminate and a resin sheet, each of which included a homogeneous resin portion having no sea-island structure, were fabricated using the materials of Example 3 except polydimethylsiloxane, that is, using the maleimide compound, the amine compound and the fused silica filler. The characteristics of the laminate and the resin sheet were estimated.

Further, element packages in the number of 100 were soldered by surface packaging onto each of printed-wiring circuit boards in each of which a predetermined circuit was formed on the laminate covered with the copper foils as explained in Example 1 (in other words, the element packages were mounted on both the surfaces of each of the printed-wiring circuit boards by soldering). The soldering was carried out by heating-reflow which utilized a far-infrared heater. Each of the samples of packaged articles was tested for 100 cycles in conformity with the MIL (military specification and standards), and the number of defects of soldered connection parts after the end of the test was counted. The measured characteristics of the above examples including the number of the defective soldered connection parts are listed in Table 1 below:

|  | Coeff. of In-plane thermal expansion (×10⁶/K) | Elastic modulus (kg · f/mm²) | Glass transition temperature (°C.) | Number of Defective parts (in 100 parts) |
| --- | --- | --- | --- | --- |
| Example 1 | 9.2 | 295 | 156 | 0 |
| Example 2 | 8.7 | 280 | 175 | 0 |
| Example 3 | 7.2 | 300 | 285 | 0 |
| Example 4 | 6.5 | 320 | 173 | 0 |
| Comp. Ex. 1 | 12.5 | 370 | 155 | 11 |
| Comp. Ex. 2 | 11.5 | 450 | 285 | 17 |

(Example 5)

FIG. 1 illustrates the construction of a laminate according to the present invention.

The laminate can be fabricated by stacking and bonding two pieces of prepreg each of which is obtained in such a way that a woven reinforcement 1 is impregnated with a resin portion 2 having a sea-island structure and is then dried. In the construction, the woven reinforcement 1 exists entirely in the planar direction of the laminate. Therefore, the effect of reducing the thermal expansion coefficient of the laminate in the planar direction thereof can be utilized to the utmost on the basis of the sea-island structure. Incidentally, numeral 3 in FIG. 1 designates a dispersed (island) phase.

Since an organic resin matrix constituting the resin portion 2 of the sea-island structure is continuously existent penetrating the reinforcement members 1, the laminate is free from the problem of bonding at the interface between different phases in a composite material.

(Comparative Example 3)

Figure 2:
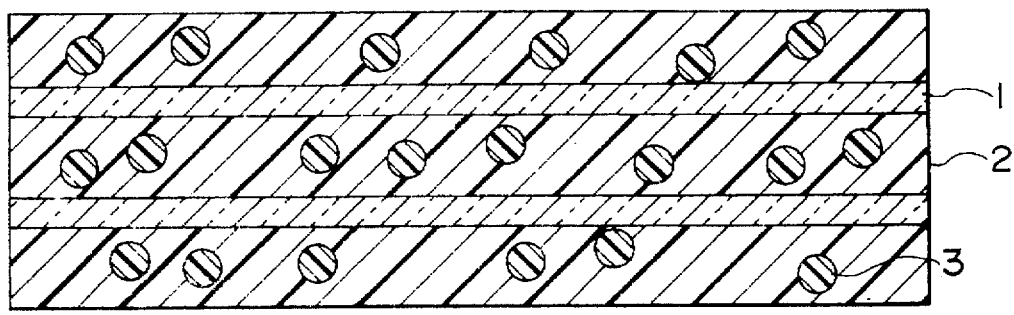
FIG. 2 is a model diagram showing the section of a laminate in the prior art.

FIG. 2 illustrates the construction of a laminate in the prior art.

The construction is very effective in reducing the thermal expansion coefficient of the laminate in the planar direction thereof. In this construction, however, a resin matrix which constitutes a resin portion 2 of sea-island structure including islands 3 does not continuously penetrate reinforcement members 1. Therefore, the laminate is liable to pose the problem of bonding at the interface between different phases, and so forth.

(Comparative Example 4)

Figure 3:
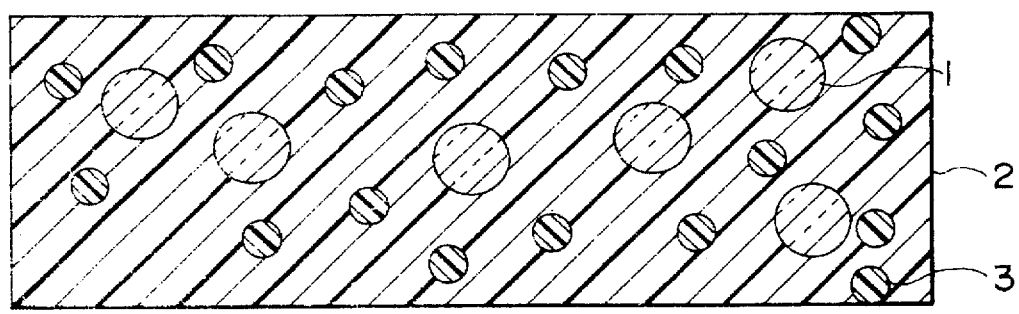
FIG. 3 is a model diagram showing the section of another laminate in the prior art.

FIG. 3 illustrates the construction of a laminate in the prior art.

In the construction, a woven reinforcement 1 exists in the form of independent particles, so that the whole laminate exhibits an isotropy. It is therefore impossible to make the most of the effect of reducing the thermal expansion coefficient of the laminate, in the planar direction thereof. Herein, the effect is based on the interaction between a resin matrix and islands 3 which form a resin portion 2 of sea-island structure.

(Examples 6–8)

88 parts (by weight) of phenol-novolak resin (trade name "XL225-3L", produced by Mitsui Toatsu Chemicals, Inc.) as a setting agent, and 10 parts, 20 parts and 50 parts (by weight) of amino-group-terminal perfluoroether type compound (produced by Mitsui Fluorochemical Kabushiki-Kaisha) as a component of low elastic modulus were respectively added to 100 parts (by weight) of epoxy compound ("EXA-1514", Dai-Nippon Ink and Chemicals, Inc.) in methyl ethyl ketone. Thus, three kinds of varnish each of which had a solid matter content of 50 (weight-%) were prepared. Pieces of E-glass (electrical glass) cloth each being 100 (μm) thick were respectively impregnated and coated with the varnish samples, and then dried at 120 (°C.) for 10 (min) so as to remove the solvent. Thus, pieces of prepreg were obtained. The resin content of each of the obtained prepreg pieces was 70 (weight-%).

Copper foils (each being 18 (μm) thick) were respectively superposed on both the surfaces of each of the obtained prepreg pieces, and the resulting structures were respectively pressed under heat by a press. Thus, laminates were obtained. As pressing conditions on this occasion, two-stage reactions at 130 (°C.) for 30 (min) and at 180 (°C.) for 60 (min) were performed, and a pressure of 20 (kg/cm²) was held. The copper foil peeling strengths of the obtained laminates, and the thermal expansion coefficients of the laminates in the planar directions thereof after having etched the copper foils were respectively evaluated by the TMA (Thermal Mechanical Analyzer) method. Besides, in order to measure the elastic moduli of the resin portions of the laminates, powdery resins were respectively scratched off the corresponding prepreg pieces, and resin sheets were respectively fabricated from the powdery resins under the same pressing conditions as those of the laminates. The samples of the resin sheets had their elastic moduli at room temperature evaluated by viscoelastic measurements, respectively.

(Example 9)

Resin components were prescribed in such a way that 55 parts (by weight) of phenol-novolak (trade name "H100", produced by Hitachi Chemical Co., Ltd.) as a setting agent and 15 parts (by weight) of carboxyl-group-terminal perfluoroether type compound (produced by Mitsui Fluorochemical Kabushiki-Kaisha) as a component of low elastic modulus were added to 100 parts (by weight) of epoxy compound ("YX4000H", Yuka Shell Kabushiki-Kaisha). On this occasion, the setting agent and the component of low elastic modulus were reacted at 90 (°C.) for 30 (min) in methyl isobutyl ketone beforehand as a pre-reaction, and the resulting solution was cooled down to a room temperature. Thereafter, the epoxy compound was added into the cooled solution. Thus, a varnish which had a solid matter content of 50 (weight-%) was prepared. A piece of S-glass (structural glass) cloth 70 (μm) thick was impregnated and coated with the prepared varnish, and then dried at 140 (°C.) for 10 (min) so as to remove the solvent. Thus, a piece of prepreg was obtained.

A laminate and a resin sheet were fabricated from the obtained prepreg by the same methods as in Examples 6~8, and their characteristics were similarly estimated.

Likewise to Examples 1 thru 4 and Comparative Examples 1 and 2, packaged articles were fabricated for Examples 6 thru 9, and the samples thereof were tested as to the defects of soldered connection parts.

The measured characteristics of Examples 6 thru 9 are listed in Table 2 below:

TABLE 2

| | Coeff. of In-plane thermal expansion (×10⁶/K) | Elastic modulus (kg · f/mm²) | Glass transition temperature (°C.) | Number of Defective parts (in 100 parts) |
| --- | --- | --- | --- | --- |
| Example 6 | 8.7 | 297 | 188 | 0 |
| Example 7 | 8.5 | 290 | 195 | 0 |
| Example 8 | 7.6 | 280 | 197 | 0 |
| Example 9 | 8.0 | 282 | 202 | 0 |

According to the present invention, the coefficients of thermal expansion of a laminate, a multilayer printed circuit board and a prepreg in the planar directions thereof are reduced along with the elastic moduli thereof, thereby making it possible to remarkably lower thermal stresses which arise on packaging surfaces and to sharply enhance the reliabilities of the connections of the laminate etc. with articles or elements which are to be packaged.

(Embodiment 10)

Figure 4:
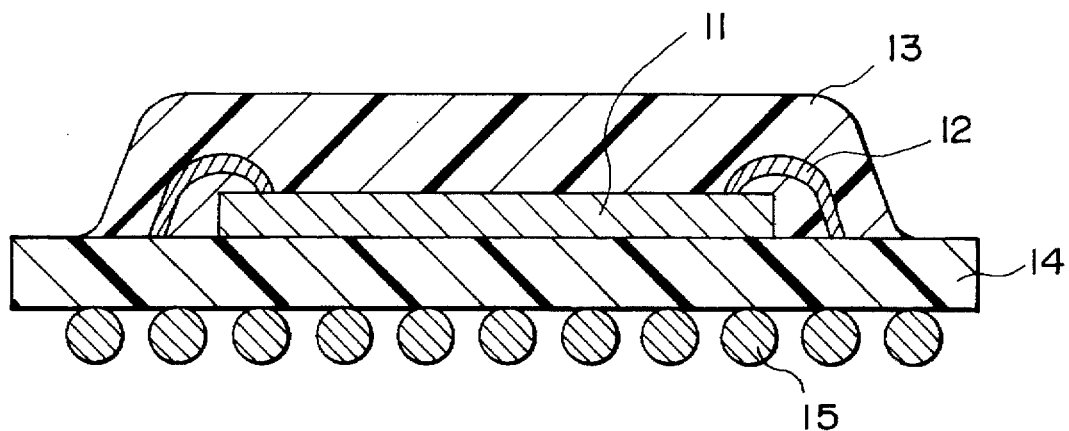
FIG. 4 is a schematic cross-sectional view of a semiconductor device in Embodiments 10 and 11.

A semiconductor device is obtained by mounting a semiconductor element 11 formed of a silicon chip on a carrier substrate 14 shown in FIG. 4, which is a laminated plate (thermal expansion coefficient in a planar direction: 8.5 ppm/K) formed of varnish composed of 100 weight part of epoxy compound (Dai-Nippon Ink Chemical Co,; EXA-1514), 88 weight part of phenol-novolak resin (Mitsui-Toyo Kouatsu Co,; XL225-3L), 10 weight part of amin-denaturated-dimethyl-siloxane (Chisso Co.; PS513) and E-glass cloth (thickness of 100 μm), by wiring using lead wires 12 through wire bonding method, by molding the mounting surface with an encapsulating material 13 composed of an epoxy group resin (filler content: 82 volume percent, thermal expansion coefficient: 8.5 ppm/K), and by forming a solder ball grid array 15 on the mounting surface of the carrier substrate 14. The thermal expansion coefficient characteristic of said semiconductor device is shown in Table 3.

TABLE 3

| EMBODIMENT | THERMAL EXPANSION COEFFICIENT OF ENCAPSULATING MATERIAL (ppm/K) | THERMAL EXPANSION COEFFICIENT OF CARRIER SUBSTRATE (ppm/K) | DIFFERENCE IN THERMAL EXPANSION COEFFICIENTS (ppm/K) |
| --- | --- | --- | --- |
| 10 | 8.5 | 8.5 | ≈0 |
| 11 | 7.0 | 6.8 | 0.2 |
| 12 | 8.0 | 8.5 | 0.5 |
| 13 | 6.5 | 6.8 | 0.3 |

(Embodiment 11)

A semiconductor device is obtained by mounting a semiconductor element 11 formed of a silicon chip on a carrier substrate 14, which is a laminated plate (thermal expansion coefficient in a planar direction: 6.8 ppm/K) formed of varnish composed of 100 weight part of maleimide compound (Mitsui-Toyo Kouatsu Co.; bis(4-maleimde-phenyl) methane), 38 weight part of amine compound (Wakayama Fine Chemical Co.; 2,2-bis(4-(4-amino-phenoxy)phenyl-propane), 5 weight part of amin-denaturated-poly-dimethyl-siloxane (Toray Silicone Co., Ltd.; SF8418) and T-glass cloth (thickness of 100 μm), by wiring using lead wires 12 through wire bonding method, by molding the mounting surface with an encapsulating material 13 composed of an epoxy group resin (filler content; 83.5 volume percent, thermal expansion coefficient: 7.0 ppm/K), and by forming a solder bump ball grid array 15 on the mounting surface of the carrier substrate 14. The thermal expansion coefficient characteristic of said semiconductor device is shown in Table 3.

(Embodiment 12)

Figure 5:
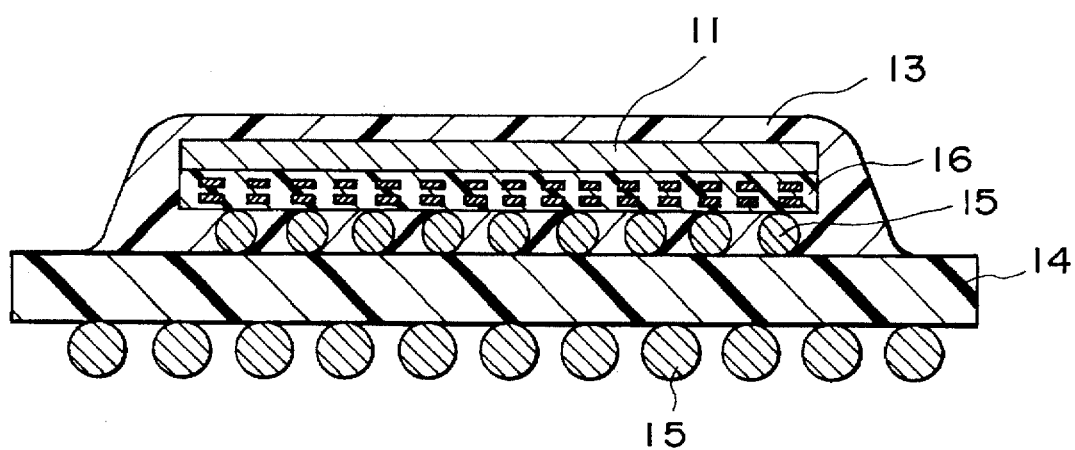
FIG. 5 is a schematic cross-sectional view of a semiconductor device in Embodiments 12 and 13.

As shown in FIG.5, two layers of multi-wiring layer 16 using polyimide-copper wiring are formed on the surface of a semiconductor element 11 through sequentially laminating method, and a solder ball grid array 15 is formed in the outmost layer of the multi-wiring layer. This object is mounted on and electrically connected to a carrier substrate 11 used in Embodiment 10, the mounting surface being molded with an epoxy group encapsulating material 13 (filler content: 83 volume percent, thermal expansion coefficient: 8.0 ppm/K), a solder ball grid array being formed on the mounting surface of the carrier substrate 14 to obtain a semiconductor device. The thermal expansion coefficient characteristic of said semiconductor device is shown in Table 3.

(Embodiment 13)

A polyimide-copper wiring layer patterned is adhered on the surface of a semiconductor element 11, and another polyimide-copper wiring layer patterned is adhered further thereon to form a multi-wiring layer 16. Through holes are formed in the connecting portion of the layers by using laser, the through holes being electrically connected with plating to form the multi-wiring layer (four conductive layer structure) 16. A solder ball grid array is formed in the outmost layer of the multi-wiring layer through bump, being electrically connected to a carrier substrate 14 used in Embodiment 11, the mounting surface being molded with an epoxy group encapsulating material 13 (filler content: 84 volume percent, thermal expansion coefficient: 6.5 ppm/K). Further, a solder ball grid array is formed on the mounting surface of the carrier substrate 14 to obtain a semiconductor device. The thermal expansion coefficient characteristic of said semiconductor device is shown in Table 3.

(Embodiment 14)

Figure 6:
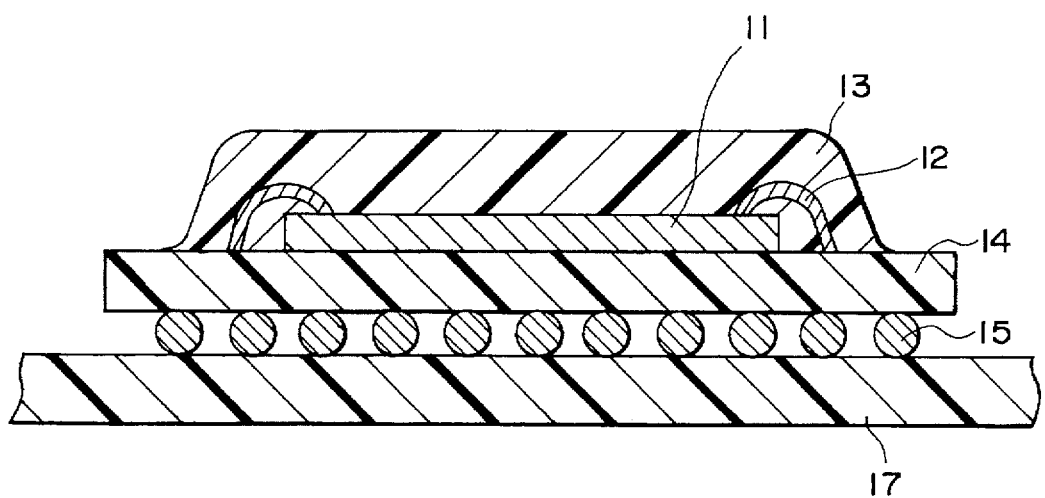
FIG. 6 is a schematic cross-sectional view of a semiconductor device in Embodiments 14 and 15.

A semiconductor device shown in FIG.6 is manufactured by mounting the semiconductor device obtained in Embodiment 10 on a mounting substrate 17 formed of the same material as the resin composition used for the carrier substrate 14 in Embodiment 10. Connecting reliability of the semiconductor device has been studied by performing thermal cycle tests. The thermal cycle test is performed under the condition of 1000 times of heat cycles of 150° C./10 minutes to −55° C./10 minutes. The thermal expansion coefficient characteristic of the semiconductor device and the result of the thermal cycle test are shown Table 4.

ductor device and the result of the thermal cycle test are shown Table 4.

(Reference 4)

A semiconductor element 11 is mounted on the carrier substrate 14 of a low thermal expansion coefficient epoxy substrate, being connected with lead wires 12 by wire bonding method, being molded with an epoxy group encapsulating material 3 (filler content of 80 volume percent). And a solder ball grad array is formed on the mounting surface of the carrier substrate 14. With the semiconductor element mounted on the FR-4 mounting substrate 17, the same thermal cycle test as in Embodiment 14 is conducted to evaluate the connecting reliability. The thermal expansion coefficient characteristic of the semiconductor device and the result of the thermal cycle test are shown Table 4.

TABLE 4

|  | THERMAL EXPANSION COEFFICIENT OF ENCAPSULATING MATERIAL (ppm/K) | THERMAL EXPANSION COEFFICIENT OF CARRIER SUBSTRATE (ppm/K) | THERMAL EXPANSION COEFFICIENT OF MOUNTING SUBSTRATE (ppm/K) | THERMAL CYCLE TEST (NUMBER OF FAILURE/NUMBER OF TEST SAMPLES) |
| --- | --- | --- | --- | --- |
| EMBODIMENT 14 | 7.0 | 6.8 | 8.5 | 0/10 |
| EMBODIMENT 15 | 8.5 | 8.5 | 11.0 | 0/10 |
| EMBODIMENT 16 | 6.5 | 6.8 | 7.0 | 0/10 |
| REFERENCE 3 | 12.0 | 17.0 | 15.0 | 8/10 |
| REFERENCE 4 | 8.0 | 11.0 | 11.0 | 2/10 |

(Embodiment 15)

The semiconductor device obtained in Embodiment 10 is mounted on an epoxy group multi-layer substrate 17 (composing material: Shin-Koube Electric Co. CEL-445, thermal expansion coefficient in a planar direction: 11 ppm/K, and the same thermal cycle test as in Embodiment 14 is conducted to evaluate the connecting reliability. The thermal expansion coefficient characteristic of the semiconductor device and the result of the thermal cycle test are shown Table 4.

(Embodiment 16)

The semiconductor device obtained in Embodiment 13 is mounted on a polyimide group multi-layer substrate 17 (reinforcing material: alamid fiber (technola). CEL-445, thermal expansion coefficient in a planar direction: 7.0 ppm/K). and the same thermal cycle test as in Embodiment 14 is conducted to evaluate the connecting reliability. The thermal expansion coefficient characteristic of the semiconductor device and the result of the thermal cycle test are shown Table 4.

(Reference 3)

A semiconductor element 11 is mounted on the carrier substrate 14 of common FR-4 (ANSI (American National Standard Institute) standard), being connected with lead wires 12 by wire bonding method, being molded with an epoxy group encapsulating material 13 (filler content of 72 volume percent). And a solder ball grid array is formed on the mounting surface of the carrier substrate 14. With the semiconductor element mounted on the FR-4 mounting substrate 17, the same thermal cycle test as in Embodiment 14 is conducted to evaluate the connecting reliability. The thermal expansion coefficient characteristic of the semicon-

What is claimed is:

1. A printed circuit board for mounting one or more semiconductor elements thereon, comprising at least one insulating layer exhibiting a coefficient of thermal expansion of 3.0–10 (ppm/K) in a planar direction thereof and a glass transition temperature of 150°–300° C., said insulating layer comprising a resin portion of a sea-island structure and a woven reinforcement, said resin portion comprising a first resin and an organic compound filler dispersed in said resin, said organic compound filler being immiscible with said first resin and forming with said first resin a phase separation structure.

2. The printed circuit board of claim 1 wherein said first resin comprises a thermosetting resin, and said organic compound filler comprises an organic compound selected from the group consisting essentially of a siloxane-containing compound, a polymer of a siloxane-containing compound, a fluorine-containing compound, and a polymer of a fluorine-containing compound.

3. The printed circuit board of claim 1 wherein said resin portion further comprises an inorganic filler dispersed therein.

4. The printed circuit board of claim 3 wherein said resin comprises a thermosetting resin, and said organic compound filler comprises an organic compound selected from the group consisting essentially of a siloxane-containing compound, a polymer of a siloxane-containing compound, a fluorine-containing compound, and a polymer of a fluorine-containing compound.

5. The printed circuit board of claim 1 wherein said first resin comprises a resin selected from the group consisting of epoxy resin, unsaturated polyester resin, epoxy-isocyanate resin, maleimide resin, maleimide-epoxy resin, cyanate-ester resin, cyanate-ester-epoxy resin, cyanate-ester-maleimide resin, phenolic resin, diallyl-phthalate resin, urethane resin, cyanamide resin, and maleimide-cyanamide resin.

6. The printed circuit board of claim 1 wherein said organic compound filler comprises a second resin selected from the group consisting essentially of a polymer of perfluoro-ether, poly-tetrafluoro-ethylene, copolymers of poly-tetrafluoroethylene and perfluoro-alkylvinyl-ether, a copolymer of tetrafluoroethylene and hexafluoro-propane, polychlorotrifluoro-ethylene, a copolymer of ethylene and tetrafluoro-ethylene, polyvinylidene fluoride, and polyvinyl fluoride.

7. The printed circuit board of claim 6 wherein said first resin comprises an epoxy resin, and said organic compound filler comprises a polymer of perfluoro-ether.

8. A printed circuit board for mounting one or more semiconductor elements thereon, comprising at least one insulating layer exhibiting a coefficient of thermal expansion of 3.0–10 (ppm/K) in a planar direction thereof and a glass transition temperature of 150°–300° C., said insulating layer comprising a resin portion of a sea-island structure and a woven reinforcement, said resin portion comprising a first resin and a second resin of an organic compound dispersed in said first resin, said second resin being immiscible with said first resin and forming with said first resin a phase separation structure.

* * * * *